United States Patent [19]
Reinholz

[11] Patent Number: 4,939,452
[45] Date of Patent: Jul. 3, 1990

[54] ARRANGEMENT FOR TESTING PRINTED-CIRCUIT BOARDS

[75] Inventor: Robby Reinholz, Berlin, Fed. Rep. of Germany

[73] Assignee: Siemens Aktiengesellschaft, Berlin & Munich, Fed. Rep. of Germany

[21] Appl. No.: 317,287

[22] Filed: Feb. 28, 1989

[30] Foreign Application Priority Data

Feb. 29, 1988 [DE] Fed. Rep. of Germany ....... 3806792

[51] Int. Cl.$^5$ .......................... G01R 1/06; G01R 31/02
[52] U.S. Cl. ................................. 324/158 F; 324/158 P
[58] Field of Search ............ 324/158 F, 158 P, 73 PC; 439/55, 638; 361/386, 387, 398

[56] References Cited

U.S. PATENT DOCUMENTS

| | | | |
|---|---|---|---|
| 4,340,858 | 7/1982 | Malloy | 324/158 P |
| 4,465,972 | 8/1984 | Sokolich | 324/158 F |
| 4,614,386 | 9/1986 | Driller et al. | 324/158 F |
| 4,707,657 | 11/1987 | Boegh et al. | 324/158 F |

FOREIGN PATENT DOCUMENTS

| | | | |
|---|---|---|---|
| 0142119 | 12/1986 | European Pat. Off. | |
| 63-75964 | 11/1988 | Japan | 324/73 PC |

Primary Examiner—Reinhard J. Eisenzopf
Assistant Examiner—Vinh P. Nguyen
Attorney, Agent, or Firm—Kenyon & Kenyon

[57] ABSTRACT

An arrangement for testing printed-circuit boards, in the case of a known arrangement, the adaptor device contains two sets of printed-circuit boards arranged side-by-side, which each have contacts on their narrow input-side in an interval, which corresponds to half of the standard contact spacing. Circuit-board conductors connect these contacts to contact elements on a narrow output-side, opposite the narrow input-side. These contact elements lie in standard contact spacing. By placing the two sets of printed circuit-boards, one over another in a cross-wise arrangement, a printed-circuit board to be tested with a small contact spacing can be connected to contact surfaces in a basic grid. Supporting the adaptor device, when contact is made with the test place, is made more difficult, as a result of the contact elements located on the bottom side. In the arrangement, the contact elements in the area of at least one narrow output-side of each printed-circuit board bordering on the narrow input-side are arranged one behind the other in the direction of the narrow output-side. Contact pieces of an electric connection panel are situated in bore holes introduced from one narrow output-side and extending up to the contact elements. In the arrangement, the adaptor device can easily be adequately supported on the side opposite the printed-circuit board to be tested.

9 Claims, 5 Drawing Sheets

ARRANGEMENT FOR TESTING PRINTED-CIRCUIT BOARDS

BACKGROUND OF THE INVENTION

The present invention relates to an arrangement for testing printed-circuit boards having an electric connection panel linked to an evaluator arrangement and having an adaptor device, which, on the one hand, can be connected to the printed-circuit board to be tested and, on the other hand, is linked to the electric connection panel, whereby the adaptor device consists of several printed circuit-boards lying side- by-side and at a right angle to the surface of the printed-circuit board to be tested, which are connected over circuit-board conductors to contact elements on the printed-circuit boards, turned toward the connection panel.

In a known arrangement of this type (EP 0 142 119 B1), the adaptor device contains two sets of printed-circuit boards lying side-by-side, which each have contacts on their narrow input-side, which are arranged in intervals corresponding to half of the standard contact spacing of 2.54 mm. These contacts are connected over circuit-board conductors on the printed circuit-boards to contact elements, which lie on a narrow output side of the printed circuit boards, opposite the narrow input-side. These contact elements are arranged on the narrow output-side in intervals, which correspond to the standard contact spacing. By placing the two sets of printed circuit-boards, designed according to the described method, one over another in a cross-wise arrangement, test points on the printed-circuit board to be tested, arranged in half of the standard contact spacing, can be connected with contact surfaces on a basic grid, whereby the contact surfaces are distributed in the standard contact spacing arrangement. In this way, an evaluator arrangement connected through an electric connection panel cannot only test printed-circuit boards with test points in standard contact spacing, but can also test printed-circuit boards with test points in half of this contact spacing. In the case of the known arrangement, the electric connection panel, which connects the contact surfaces on the basic grid with the evaluator arrangement, is located below the basic grid.

SUMMARY OF THE INVENTION

According to the present invention, in an arrangement of the type indicated in the beginning, the contact elements in the area of a narrow output-side of each printed-circuit board, running diagonally to the narrow input-side, are arranged one behind the other in the direction of this narrow side. Also, contact pieces of the electric connection panel are located in bore holes, which lead from the narrow output-side of each printed-circuit board up to the contact elements.

An important advantage of the arrangement for testing printed-circuit boards, according to the invention, is that, as a result of the electric connection panel, which engages laterally on the adaptor device, the adaptor device can easily be adequately supported on the side lying opposite the printed-circuit board to be tested. This is due to the fact that this side of the adaptor device differs from the known arrangement, in that it is not provided with the electric connection panel. This is especially important, because often a large number of contacts must be configured to test the printed-circuit board, which usually can only be effected by applying a high contact pressure. To realize this, the adaptor device must be stably supported.

The objects of the invention are achieved by an arrangement for testing printed-circuit boards having an electric connection panel linked to an evaluator arrangement and having an adaptor device, which, on the one hand, can be connected to the printed-circuit board to be tested and, on the other hand, is linked to the electric connection panel, whereby the adaptor device comprises several printed circuit-boards lying side-by-side and at a right angle to the surface of the printed-circuit board to be tested, which each have contacts on their narrow input-side, turned toward the printed circuit-board to be tested, which are connected over circuit-board conductors to the contact elements on the printed-circuit boards, turned toward the connection panel, wherein the contact elements in the area of at least one narrow output-side of each printed-circuit board, running diagonally to the narrow input-side, are arranged one behind the other, in the direction of this narrow side, and that the contact pieces of the electric connection panel are located in bore holes, which lead from at least one narrow output-side of each printed-circuit board up to the contact elements.

Supporting the electric connection panel laterally on the adaptor device has the additional advantage, that the computing arrangement can be installed close to the adaptor device. As a result, on the one hand, the testing speed can be increased, by avoiding relatively long electric lines and, on the other hand, the operation is facilitated. If occasion arises, the computing arrangement or its individual modules can even be attached to the electric connection panel.

If the printed-circuit boards of the adaptor device have a rectangular design, because they are made from a simple blank, then the contact elements are arranged in the area of at least one narrow output-side, which borders on the narrow input-side.

In an especially advantageous exemplified embodiment of the arrangement, according to the invention, the printed-circuit boards of the adaptor device have an angular shape, and the outside of one shank of the printed-circuit boards forms the narrow input-side, and the inside of another shank forms the narrow output-side. The special advantage of this exemplified embodiment is that the electric connection panel and, possibly also at least parts of the computing arrangement are accommodated compactly inside the outer (rectangular) contour of the angular printed-circuit board.

In the arrangement, according to the invention, the contact elements in the area of the narrow output-side of each printed-circuit board can be arranged one behind the other in a spacing, which differs from that of the narrow output-side. However, this requires then, that the contact pieces of the electric connection panel have different lengths. Therefore, it is considered advantageous, if the contact elements are arranged one behind the other, parallel to the narrow output-side of the printed-circuit boards. In this case then, the contact pieces of the electric connection panel extend by equal distances into the printed-circuit boards, so that the contact pieces can be of the same length.

The contacts on the narrow input-side of the printed-circuit boards can have different designs. For example, they can be modeled as rigid or flexible pins or also in the form of contact shafts. Possibly, the contacts can also be made from metal-plated areas of the narrow input-side of the printed-circuit boards. With a view to manufacture of the contacts in the simplest way possible, it is considered especially advantageous, if these contact surfaces are made of conductive material, introduced from the surface in the through-holes of the printed-circuit boards. To simplify the manufacturing of contact surfaces, it is advantageous to proceed by first introducing conductive material in the through-holes of the printed-circuit boards, and after that to cut off the printed-circuit board, so that the cutting edge runs through the through-holes. Then, the exposed surfaces of the conductive material in the through-holes represent the contact surfaces. However, it is also possible to cut off the printed-circuit boards after introducing the through-holes, and then to press conductive material into the exposed bore holes.

The contact elements in the printed-circuit boards can have different designs, as well. For example, they can be made of compressed pins. It is regarded as especially advantageous, however, if the contact elements are made of conductive material introduced in holes of the printed-circuit boards, because this is achieved simply with the known through plating measure.

With regard to the configuration of the contact pieces of the electric connection panel, according to the invention, the arrangement can be shaped differently, as well. Thus, the contact pieces can consist of contact shafts with introducible plugs or of soldered cable ends. Preference is given to a configuration, however, where the contact pieces are connector pins, which extend in the bore holes up to the contact elements. The computing arrangement can then be easily linked or attached to these connector pins.

If the arrangement, according to the invention, is used to test printed-circuit boards with test points arranged in the standard contact spacing, then each printed-circuit board has a thickness corresponding to the standard contact spacing of test points on the printed-circuit board to be tested and bears centrically the bore holes in its narrow output-side.

If, on the other hand, the printed-circuit board to be tested has test points in half of the standard contact spacing, then each printed-circuit board has a thickness of not more than half of the standard contact space of the printed-circuit board to be tested, and two printed-circuit boards each form a printed-circuit board unit with a thickness corresponding to the standard contact spacing, whereby contacts distributed on the narrow input-side in half of the standard contact spacing are connected in such a way to contact elements lying one behind the other in the standard contact spacing on the narrow output-side of the printed-circuit board unit, that contacts lying in pairs side-by-side on both printed-circuit boards are connected to successive contact elements and successive pairs of contacts are connected to following contact elements. The bore holes which contain the contact pieces of the electric connection panel are arranged, thereby, centrically to the printed circuit board unit, so that the contact pieces are arranged in the standard contact spacing on the side of the electric connection panel. The special advantage of an arrangement configured in this manner, according to the invention, is that with a single packet of printed-circuit boards or printed-circuit board units, test points on a printed circuit-board to be tested, in half of the standard contact spacing, can lead to contact pieces in the standard contact spacing. Therefore, a two-step assembly with packets of printed-circuit boards - as in the state-of-the-art treated above - is not necessary in the case of the arrangement, according to the invention.

BRIEF DESCRIPTION OF THE DRAWINGS

The invention will be described in greater detail in the following detailed description with reference to the drawings, in which.

DETAILED DESCRIPTION

Figure 1:
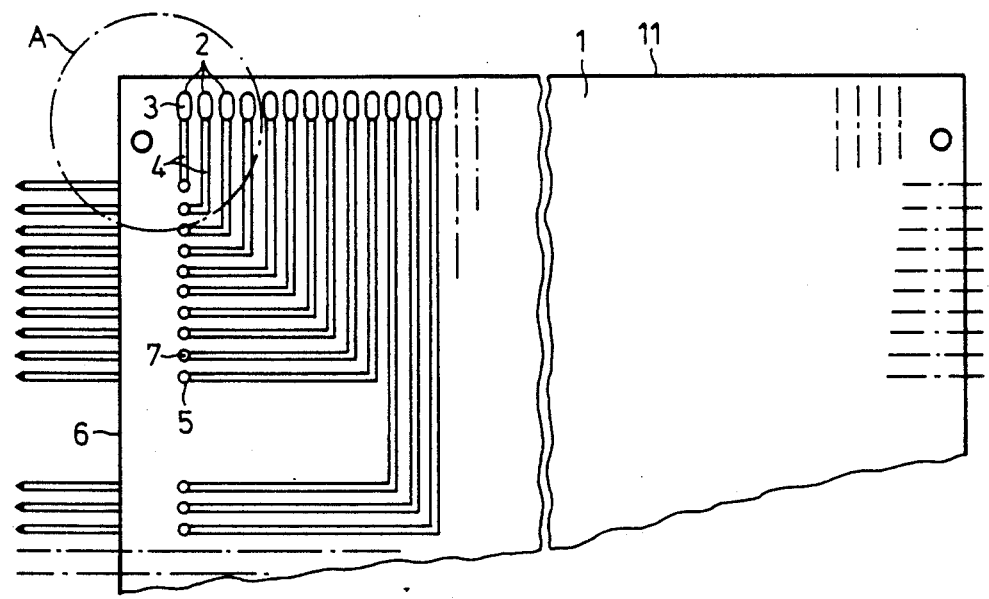
FIG. 1 is a side view of an exemplified embodiment of an adaptor device of the arrangement, according to the invention, in an intermediate manufacturing stage.

In a lateral view, FIG. 1 illustrates an almost completely finished adaptor device of the arrangement (not shown here) to test printed-circuit boards, which discloses that a printed-circuit board 1 is provided with through-holes 2, which are filled with conductive material 3. Several circuit-board conductors 4 are located on the printed-circuit board 1. They lead from the through-holes 2, or from the conductive material 3, to bore holes 5, in the area of a narrow output-side 6. These bore holes 5 are filled up with conductive material 7. The circuit-board conductors 4 are arranged so that the through-holes 2 with the conductive material 3 inside of them, from left to right in FIG. 1, are connected, one after another, from top to bottom, to throughholes 5 or to the conductive material 7 inside of them.

Blind holes 8 are introduced in the printed-circuit board 1 from the narrow output-side 6. They can be clearly seen in FIG. 2. Connector pins 9 are inserted, as contact pieces of a connection panel 10, into these blind holes 8. These blind holes lead up to the through-holes 5, which have the conductive material 7 as a contact element. These connector pins 9 are introduced up to the contact elements 7, whereby there is an electric connection from the connector pins 9, through the contact elements 7 and the circuit-board conductors 4, to the conductive material 3 in the through-holes 2.

For the sake of completeness, one should mention that, in the case of the printed-circuit board 1, to save material, other through-holes, not shown in FIG. 1, lead from the middle of the edge 11, over circuit-board conductors, to the other narrow output-side of the printed-circuit board 1, opposite the one narrow side 6. As FIGS. 2 an 3 show in detail, each printed-circuit board 1, or the printed-circuit boards 1 in the area of the through-holes 2, is cut off in a way, such that contacts 13 are formed from the conductive material 3 in the through-holes 2. These contacts 13 lie in the area of the narrow input-side 12 of each printed-circuit board 1 and, in a way not shown here, can lead towards test points on the printed-circuit board to be tested.

Figure 3:
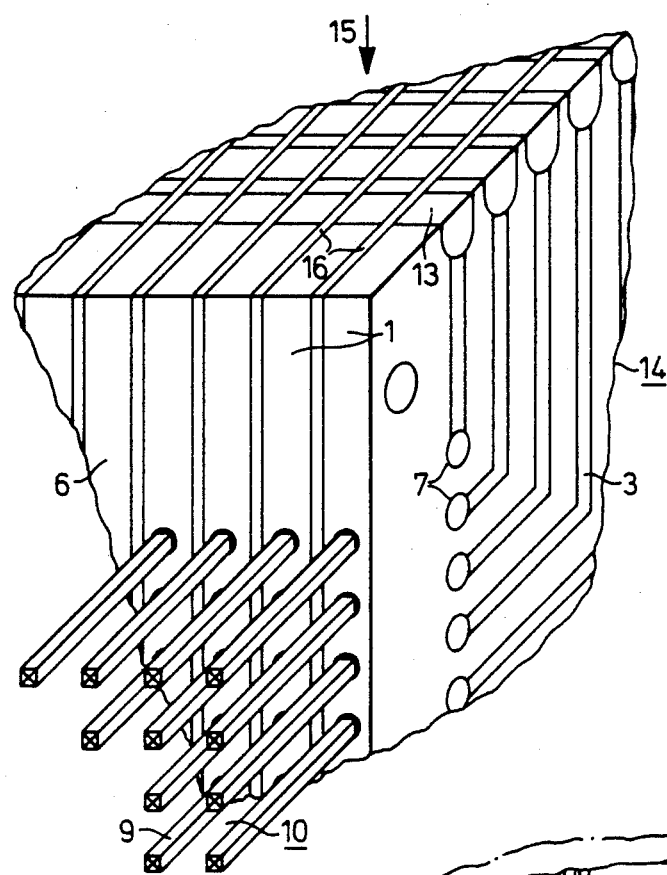
FIG. 3 is a perspective representation of detail A of the adaptor of FIG. 1 or FIG. 2 in a finished state.

Concerning the perspective representation of FIG. 3, the printed-circuit board to be tested is situated, during the testing, above the adaptor device 14 with its test points, whereby the latter lie against the contacts 13 of the adaptor device 14. Thus, an electric connection results from the test points on the printed-circuit board to be tested to the respective connector pins 9 of the electric connection panel 10, through the circuit-board conductors 4 and the contact elements 7, towards the narrow output-side 6 of the adaptor device 14. The space below the adaptor device 14 is not needed to attach the electric connection panel 10. Therefore, an outer support can be simply provided below the adaptor device 14, relative to a pressure influence exerted in the direction of the arrow 15, through the printed-circuit board to be tested (not shown here).

One can also conclude from FIG. 3, that insulating layers 16 are arranged between the individual printed-circuit boards 1. These insulating layers 16 serve to adjust tolerance, in order to guarantee intervals between the connector pins 9 in the standard contact spacing of 2.54 mm, provided that the printed-circuit boards, with test points in the standard contact spacing of 2.54 mm, are to be tested with the arrangement with the adaptor device illustrated in FIGS. 1 to 3.

Figure 4:
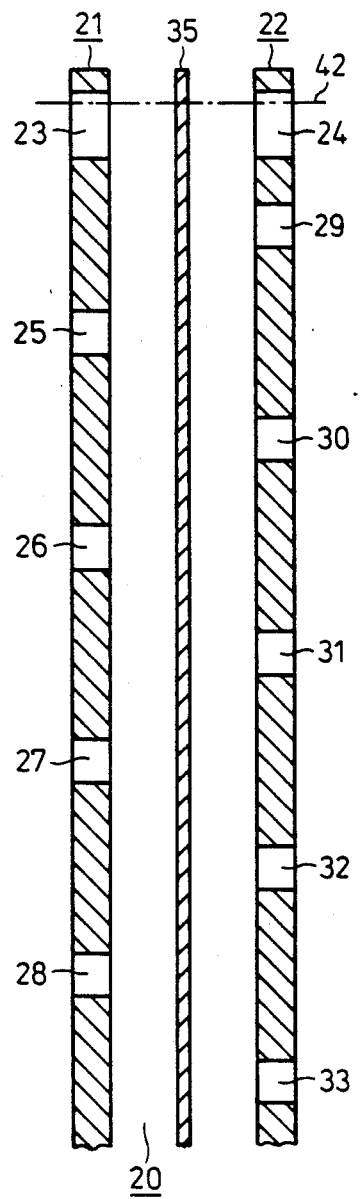
FIG. 4 is a printed-circuit board unit, according to a further exemplified embodiment, of an adaptor device of the arrangement, according to the invention, before being assembled.
Figure 5:
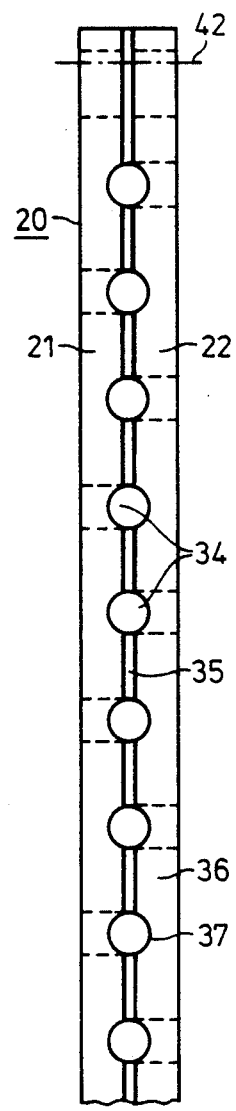
FIG. 5 is a side view of the assembled printed-circuit board unit of FIG. 4.
Figure 6:
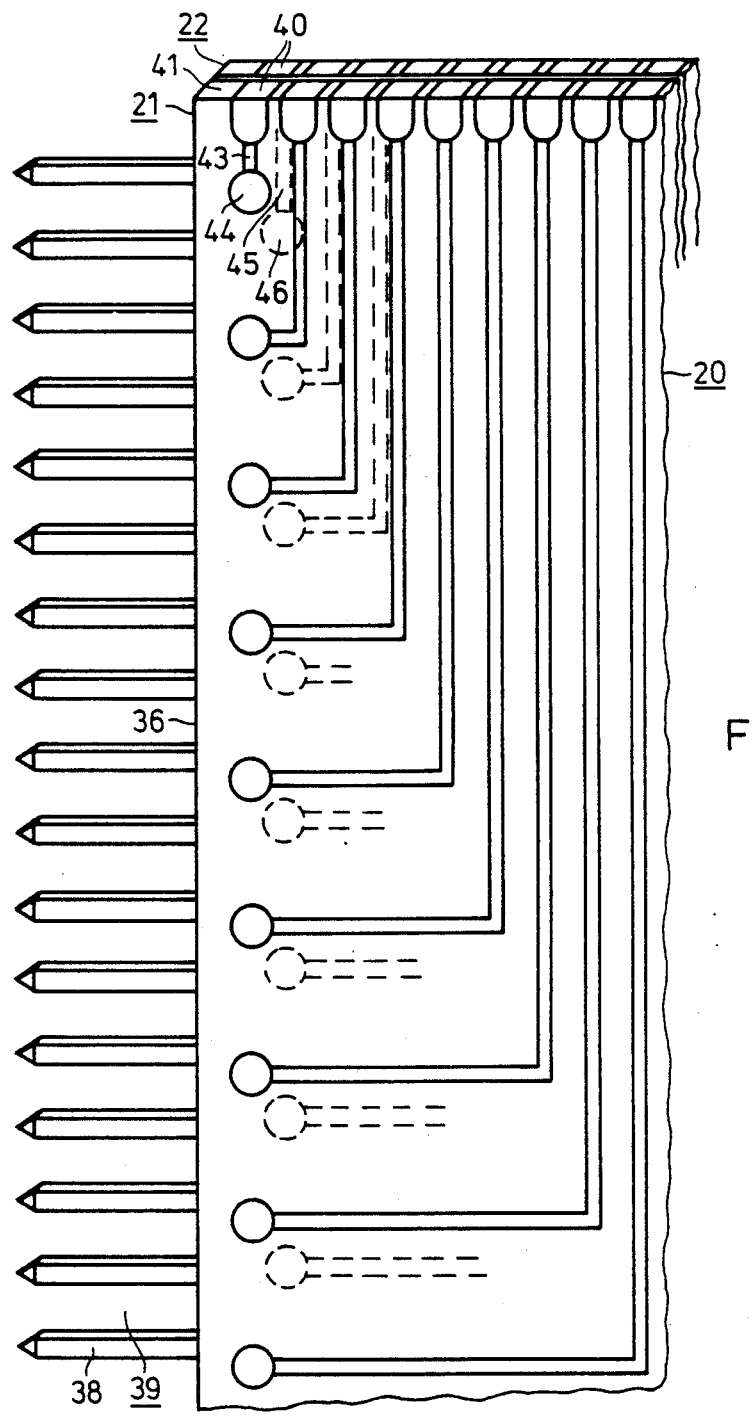
FIG. 6 is a side view of an enlarged part of a printed-circuit board unit according to FIGS. 4 and 5.

If printed-circuit boards with test points in half of the standard contact spacing are to be tested with the arrangement according to the invention, then the adaptor device is shaped, as shown in FIGS. 4 to 6. In this case, the adaptor device consists of printed-circuit board units 20, which in turn consist of two printed-circuit boards 21 and 22. Each printed-circuit board 21 or 22, thereby, has a thickness, which corresponds, at the most, to half of the standard contact spacing of 2.54 mm. Before the printed-circuit board unit is assembled, each of the printed-circuit boards 21 and 22 is provided, in the course of the manufacturing, with through-holes 23 and 24, in the area turned toward the printed-circuit board to be tested. These through-holes are filled with a conductive material within the bounds of a through-plating. Below the through-holes 23 or 24, bore holes 25, 26, 27, 28 or 29, 30, 31, 32 and 33 are located on each printed-circuit board 21 or 22. These bore holes are preferably arranged below the outermost narrow output-side 36, along the row of though-holes 23 or 24 (compare FIG. 6). Thereby, the arrangement on both printed-circuit boards 21 and 22 is made, such that one of the bore holes 25 to 28 lies between the corresponding additional bore holes 29 to 33, and all bore holes have intervals of the size as the standard contact spacing. All of the bore holes 25 to 33 are filled with conductive material, as well; this forms the contact elements 34.

In the case of the depicted exemplified embodiment, printed-circuit boards with a thickness of 1 mm are used as printed-circuit boards 21 and 22. To ensure that, after assembly (compare FIG. 5), the printed-circuit boards 21 and 22 acquire a total thickness, corresponding to the standard contact spacing of 2.54 mm, insulating material 35 is provided, with a corresponding thickness, between the printed-circuit boards 21 and 22, and on at least one surface.

After the parts 21, 22 and 35 have been assembled, for example bonded, then bore holes 37 are introduced from the narrow output-side 36 so far into the thus formed printed-circuit board unit 20, that they extend up to the contact elements 34. Then connector pins 38 of the electric connection panel 39 are introduced so far into the bore holes 37, that they make contact with the contact elements in the bore holes 25 to 33. In addition, FIG. 6 shows clearly that the contacts 40 on the narrow input-side 41 of the printed-circuit board unit 20, on the other hand, are configured, in that the printed-circuit board unit 20 is milled off along the line 42 (compare FIG. 4). Furthermore, it is apparent from FIG. 6, that the contact to the far left in FIG. 6, in the row of contacts 40 on the printed-circuit board 21, is connected over a circuit-board conductor 43 to a contact element 44. At the same time, the contact to the far left, in the row of contacts 40 on the printed-circuit board 22, is connected over a circuit-board conductor 45, shown as a dotted line, on the printed-circuit board 22, to the contact element 46, also indicated with a dotted line only, in the printed-circuit board 22. Therewith, contacts 40, situated side-by-side, in pairs, on both printed-circuit boards 21 and 22, are connected to successive contact elements 44 and 46, or to the connector pins 38 of the electric connection panel 39, which are connected to these contact elements. The connection of other contacts 40 from the narrow input-side 41 to the connector pins 38 of the electric connection panel 39 results, accordingly, and can be clearly seen in FIG. 6.

Figure 2:
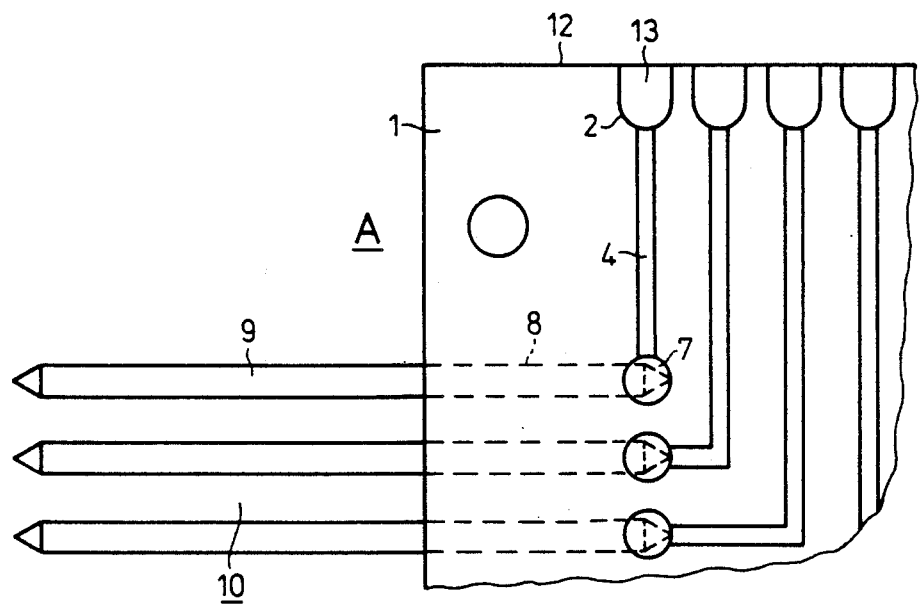
FIG. 2 shows the detail A of FIG. 1 in an enlarged scale.
Figure 7:
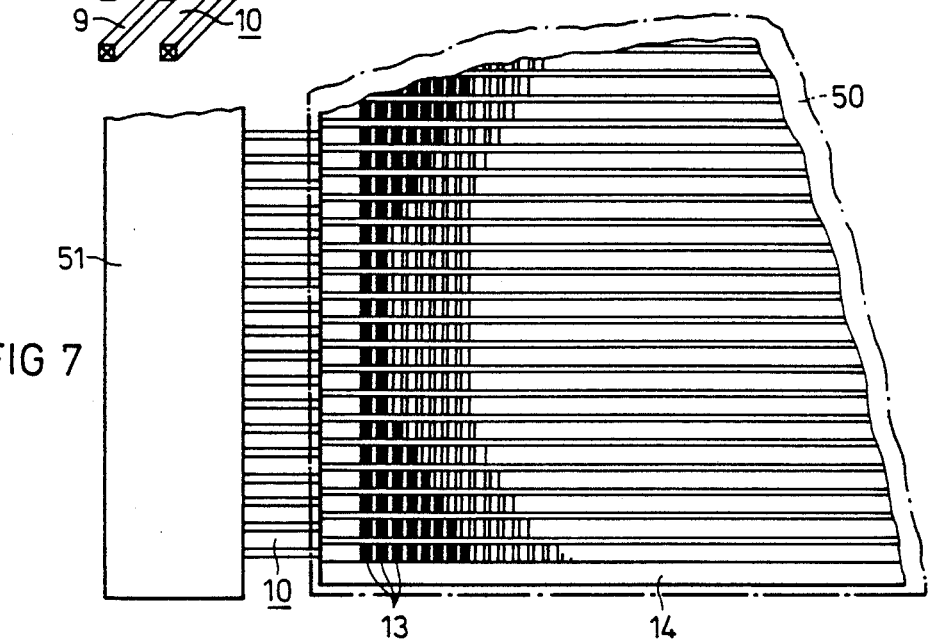
FIG. 7. is a view of a schematic representation of an exemplified embodiment of the arrangement, according to the invention.

The schematic representation of the arrangement, according to the invention, of FIG. 7 shows a cut-out view of an adaptor device 14, according to FIGS. 1 to 3. A printed-circuit board to be tested 50, outlined with a dotted line, is pressed by suitable means, not depicted here, on to this adaptor device, so that the contacts 13 of the adaptor device 14 come in galvanic contact with the corresponding test points on the printed-circuit board 50. An evaluator arrangement 51, shown only schematically and in cutaway portions, is situated on the side of the adaptor device 14. This evaluator arrangement is connected over the electric connection panel 10 to the adaptor device 14.

In the arrangement according to the invention, if necessary, the narrow input and output side can naturally be interchanged, so that the contacts would then be turned toward the computing arrangement.

Figure 8:
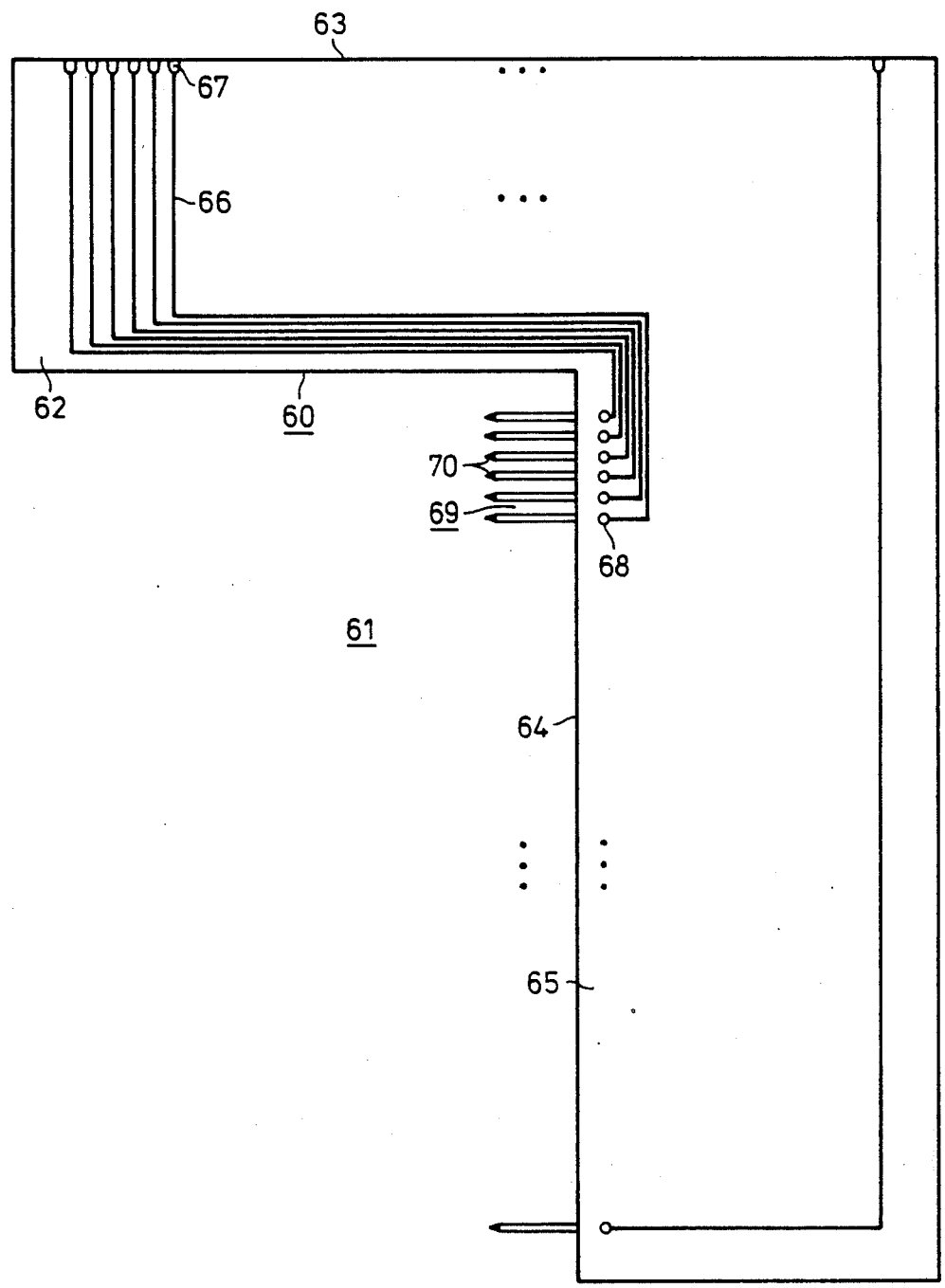
FIG. 8 is a further exemplified embodiment of the arrangement, according to the invention, in a side of view.

The exemplified embodiment of FIG. 8, for the most part, differs from the above described versions, in that the angular printed-circuit boards 60 are used to produce an adaptor device 61. With its outer surface, a shank 62 of the printed-circuit boards 60 forms the narrow input-side 63, while the inner side of the other shank 65 forms the narrow output-side 64. Circuit-board conductors 66 lead from contacts 67 on the narrow input-side 63 to contact elements 68 on the narrow output-side 64; the contacts 67 and the contact elements 68 can be designed, as already described above, in connection with FIG. 1. A connection panel 69 with contact pins 70 as contact pieces, as well as parts of the evaluator arrangement, not shown here, are arranged in the space below the shank and next to the shank 65.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. An arrangement for testing printed-circuit boards having an electric connection panel linked to an evaluator arrangement and having an adaptor device adapted to be connected to the printed-circuit board to be tested and to the electric connection panel, wherein the adaptor device comprises a plurality of adjacently disposed adaptor printed circuit-boards lying at a right angle to a surface of the printed-circuit board to be tested, said adaptor printed circuit-boards each having fixed contacts on a narrow input-side directed toward the printed circuit-board to be tested, said contacts being connected by circuit-board conductors to contact elements on the adaptor printed-circuit boards directed toward the connection panel, the contact elements directed toward the connection panel being disposed in an area of at least one narrow output-side of each adaptor printed-circuit board, the narrow output-side of each adaptor printed circuit board extending at substantially a right angle to the narrow input-side, the contact elements being arranged in a row in the direction of said narrow output-side, contact pieces of the electric connection panel being located in bore holes which lead from said at least one narrow output-side of each adaptor printed-circuit board to the contact elements.

2. The arrangement recited in claim 1, wherein the contact elements are arranged in the area of said at least one narrow output-side which borders on the narrow input-side.

3. The arrangement recited in claim 1, wherein the printed-circuit boards of the adaptor device have an angular shape, and an outside of one shank of the adaptor printed-circuit boards forms the narrow input-side, and an inside of another shank forms the narrow output-side.

4. The arrangement recited in claim 1, wherein the contact elements are arranged one behind the other, parallel to the narrow output-side of the adaptor printed-circuit boards.

5. The arrangement recited in claim 1, wherein the contacts are contact surfaces, made of conductive material, introduced from the surface in the through-holes of the adaptor printed-circuit boards.

6. The arrangement recited in claim 1, wherein the contact elements are made of conductive material introduced in holes of the adaptor printed-circuit boards.

7. The arrangement recited in claim 1, wherein the contact pieces are connector pins which extend in the bore holes to the contact elements.

8. The arrangement recited in claim 1, wherein each adaptor printed-circuit board has a thickness corresponding to the standard contact spacing of test points on the printed-circuit board to be tested and bears centrically the bore holes in the narrow output-side.

9. The arrangement recited in claim 1, wherein each adaptor printed-circuit board has a thickness of, at the most, half of a standard contact spacing of the adaptor printed-circuit board to be tested and two adaptor printed-circuit boards each form a adaptor printed-circuit board unit with a thickness corresponding to the standard contact spacing, whereby contacts distributed on the narrow input-side in half of the standard contact spacing are connected to contact elements lying one behind the other in the standard contact spacing on the narrow output-side of the adaptor printed-circuit board unit, contacts being provided lying in pairs side-by-side on both adaptor printed-circuit boards connected to successive contact elements and successive pairs of contacts being connected to following contact elements.

* * * * *